(12) United States Patent
Birner et al.

(10) Patent No.: US 7,081,384 B2
(45) Date of Patent: Jul. 25, 2006

(54) METHOD OF FORMING A SILICON DIOXIDE LAYER

(75) Inventors: Albert Birner, Dresden (DE); Matthias Goldbach, Dresden (DE); Irene Sperl, Dresden (DE)

(73) Assignee: Infineon Technologies, AG, Munich (DE)

( * ) Notice: Subject to any disclaimer, the term of this patent is extended or adjusted under 35 U.S.C. 154(b) by 100 days.

(21) Appl. No.: 10/823,607

(22) Filed: Apr. 14, 2004

(65) Prior Publication Data

US 2004/0219758 A1    Nov. 4, 2004

Related U.S. Application Data

(63) Continuation of application No. PCT/EP02/11689, filed on Oct. 18, 2002.

(51) Int. Cl.
*H01L 21/8242*    (2006.01)

(52) U.S. Cl. ............ 438/248; 438/255; 438/391; 438/398; 438/753; 438/770; 438/964

(58) Field of Classification Search ......... 438/243, 438/248, 255, 389, 391, 398, 753, 964, 770
See application file for complete search history.

(56) References Cited

U.S. PATENT DOCUMENTS

| | | | |
|---|---|---|---|
| 4,906,590 A * | 3/1990 | Kanetaki et al. | 438/386 |
| 5,508,542 A * | 4/1996 | Geiss et al. | 257/301 |
| 5,573,973 A * | 11/1996 | Sethi et al. | 438/386 |
| 5,739,565 A | 4/1998 | Nakamura et al. | |
| 5,877,061 A * | 3/1999 | Halle et al. | 438/386 |
| 5,981,350 A * | 11/1999 | Geusic et al. | 438/386 |
| 6,025,225 A * | 2/2000 | Forbes et al. | 438/243 |
| 6,271,079 B1 | 8/2001 | Wei et al. | |
| 6,352,893 B1 | 3/2002 | Michaelis et al. | |
| 6,613,642 B1 * | 9/2003 | Rahn et al. | 438/398 |
| 6,620,675 B1 * | 9/2003 | Furukawa et al. | 438/243 |
| 2004/0157452 A1* | 8/2004 | Ogawa et al. | 438/691 |

FOREIGN PATENT DOCUMENTS

| | | |
|---|---|---|
| EP | 1 294 018 A1 | 3/2003 |
| JP | 2000-357779 | 12/2000 |
| WO | WO 99/25026 A1 | 5/1999 |

OTHER PUBLICATIONS

Zorinsky E.J., et al: "The "Islands" Method—A Manufacturable Porous Silicon SOI Technology"; IEEE, IEDM 86, XP-002079454, pp. 431-434.

* cited by examiner

*Primary Examiner*—Mary Wilczewski
*Assistant Examiner*—Toniae M. Thomas
(74) *Attorney, Agent, or Firm*—Edell, Shapiro & Finnan, LLC

(57) ABSTRACT

The present invention refers to a method of forming a silicon dioxide layer by thermally oxidizing at least one monocrystalline silicon surface region on a semiconductor substrate. The silicon surface region has a curved surface. The method can include providing a semiconductor substrate having at least one monocrystalline silicon surface region having a curved surface, roughening the surface of the at least one monocrystalline silicon surface region to produce a layer of porous silicon, and thermally oxidizing the at least one roughened monocrystalline silicon surface.

28 Claims, 8 Drawing Sheets

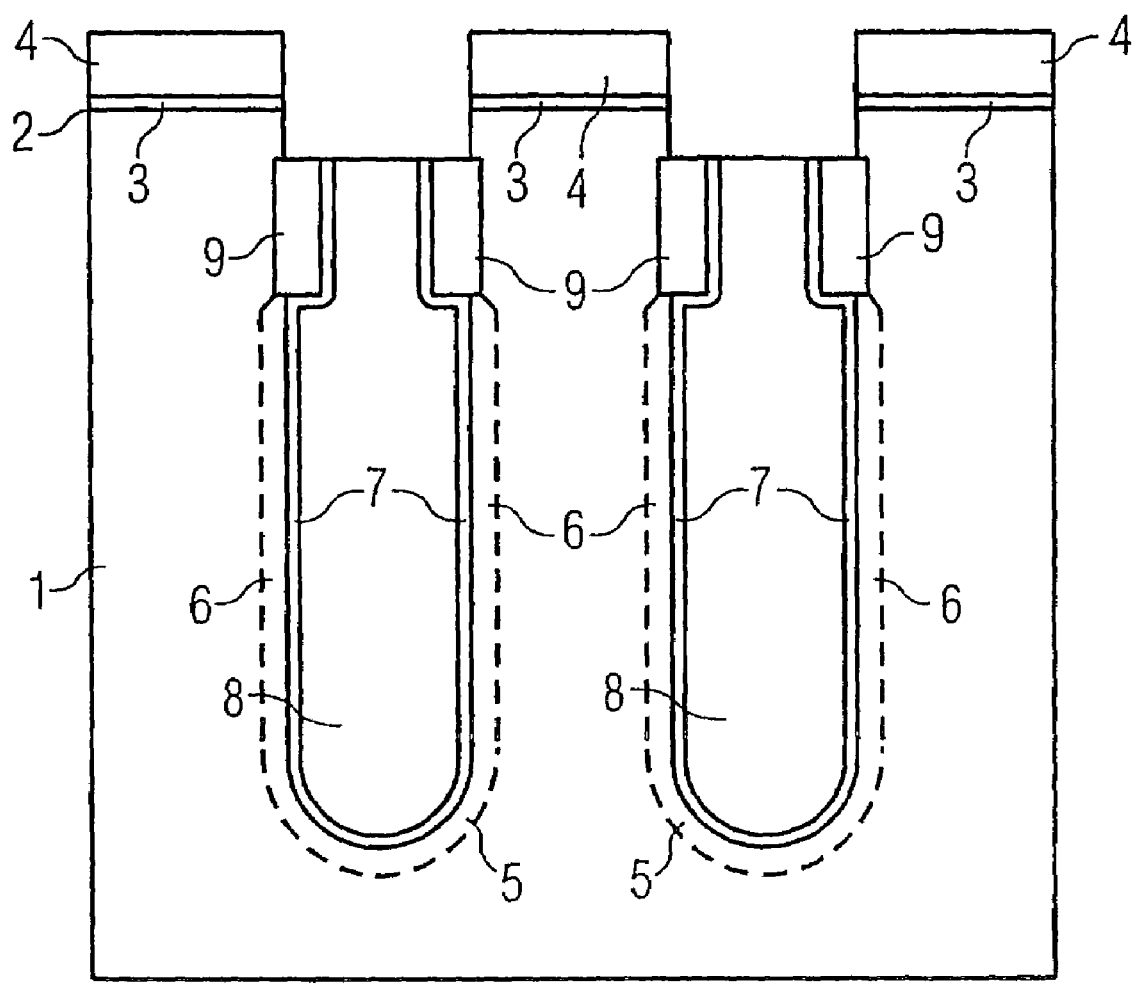

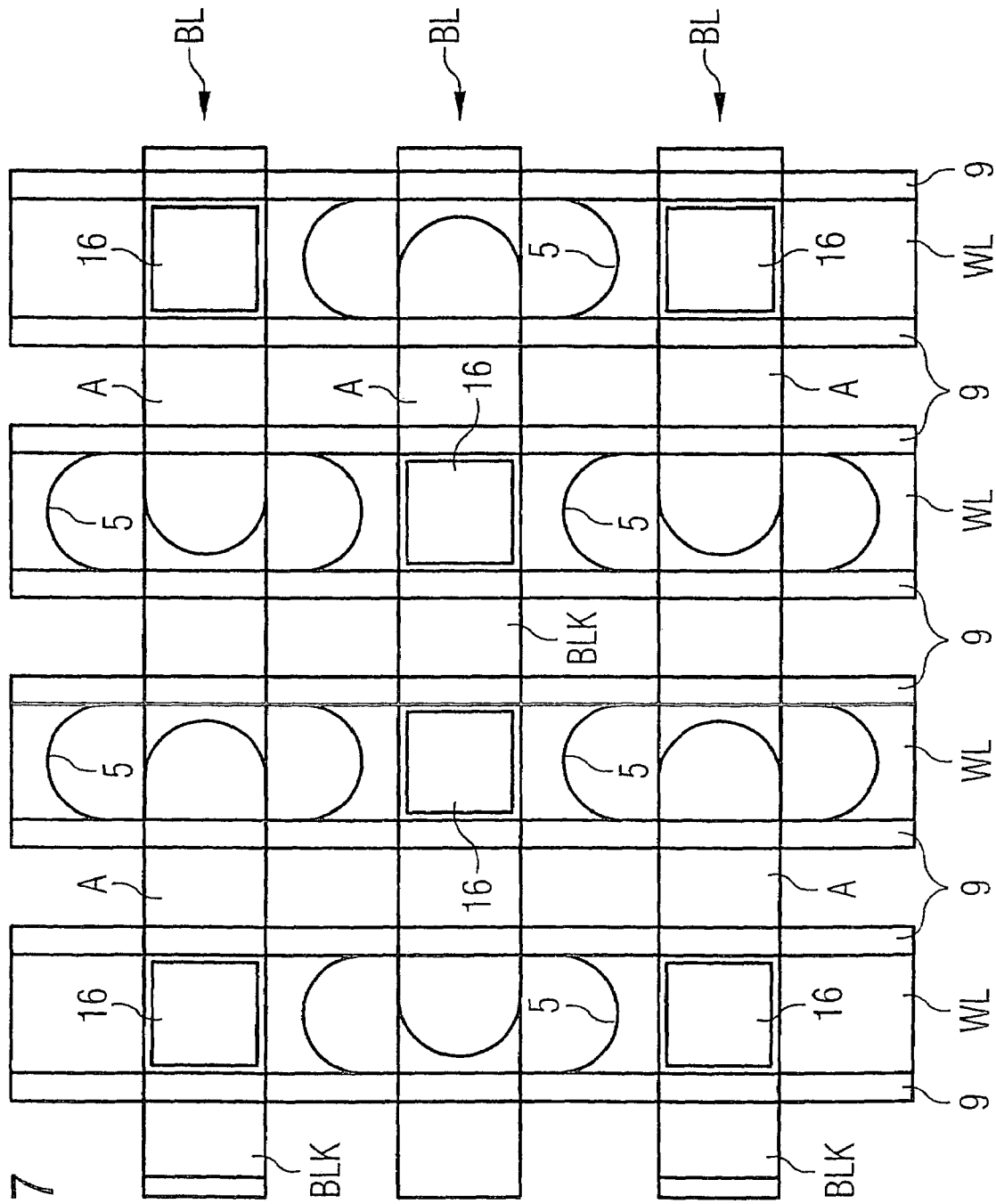

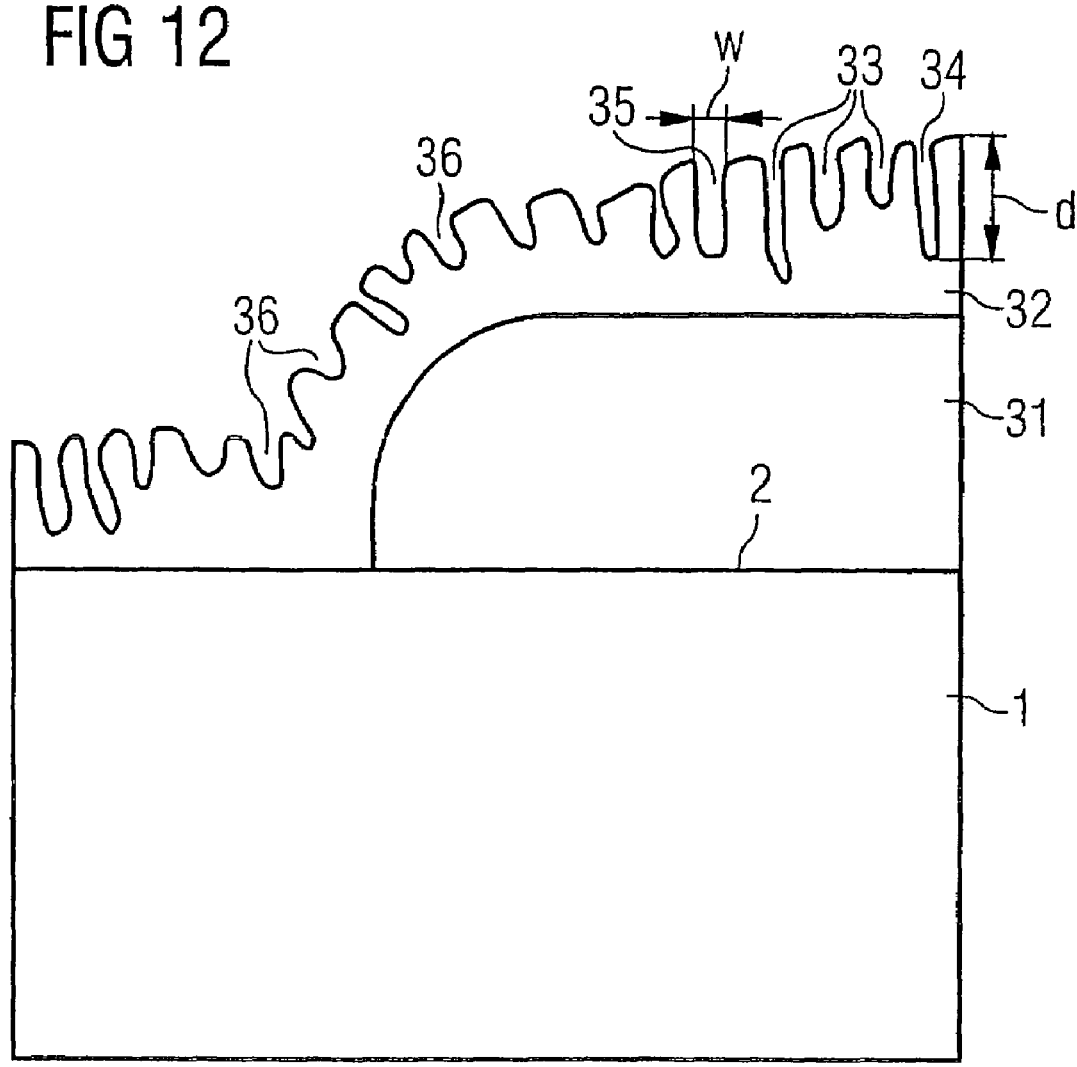

METHOD OF FORMING A SILICON DIOXIDE LAYER

CROSS-REFERENCE TO RELATED APPLICATIONS

This application is a continuation of PCT Application No. PCT/EP2002/ 11689, filed on Oct. 18, 2002, and titled "A Method of Forming A Silicon Dioxide Layer On a Curved Silicon Surface," which claims priority from European Patent Application No. EP 01125000.8, filed on Oct. 19, 2001, and titled "A Method of Forming A Silicon Dioxide Layer On a Curved Silicon Surface," the entire contents of which are hereby incorporated by reference.

FIELD OF THE INVENTION

The present invention refers to a method of forming a silicon dioxide layer by thermally oxidizing at least one silicon surface region on a semiconductor substrate.

BACKGROUND

A silicon dioxide layer which is commonly used as an isolating or passivating layer, can be generated on a silicon surface for example by thermal oxidation. Thermal oxides are grown when a silicon layer is held at a temperature between 700° C. and 1200° C. in an oxidizing atmosphere. In particular, thick field oxide layers which are used for integrated MOS circuits can be produced by the LOCOS (Local Oxidation of Silicon) process wherein the portions on which the silicon dioxide layer is not to be grown are covered by a masking layer such as made of silicon nitride.

On the one hand, the growth rate of thermal oxides usually depends on one side on the crystal orientation of the underlying silicon layer. On the other hand, if thermal oxides are to be grown on curved surfaces, the growth rate also depends on the direction and the amount of the curvature. Since during thermal oxidation the volume of the former silicon layer increases due to the interstitially embedded oxygen atoms, stress which is dependent on the specific curvature is induced, which in turn, will result in an inhomogenous growth of the silicon dioxide layer thickness.

As a consequence, only inhomogenous layer thicknesses are achieved on curved silicon surfaces.

In the past, this problem has been dealt with by thermally oxidizing only non-curved or equally curved silicon surfaces. Alternatively, the thickness of the grown silicon dioxide layer has been chosen so that even the thinnest area has the desired thickness. In addition, in the manufacture of devices demanding for homogenous oxide layer thicknesses, the silicon dioxide layer has been produced on curved silicon surfaces by a deposition method in which the growth rate does not depend on the curvature.

One example wherein it would be highly desirable to thermally grow a homogenous silicon dioxide layer on a curved silicon surface is the formation of the collar region in the upper part of the trench of a DRAM (Dynamic Random Acess Memory) cell.

Such a memory cell comprises an access transistor as well as a storage capacitor for storing a charge representing data in the form of either a logical "1" or a logical "0". When the data is read from the memory cell, sense amplifiers detect the level of the charge stored on a particular capacitor so as to produce a logical "1" or a logical "0" output based on the stored charge.

The capacitor can, for example, be formed in a trench in the semiconductor substrate. The trench is filled with a dielectric and has polysilicon acting as the top electrode of the capacitor. In order to suppress the formation of a parasitic transistor in the upper part of the capacitor trench, it is necessary to provide an isolation collar, for example, of silicon dioxide in the upper trench portion. This isolation collar has a length of approximately 1 µm and a thickness sufficient, i.e., approximately 25 nm, to suppress the transistor action. Since the trench usually assumes an oval cross section, the silicon surface is curved, which makes a uniform thermal oxide growth according to conventional methods difficult.

SUMMARY

A method of forming a thermally grown silicon dioxide layer on curved surfaces with a homogenous layer thickness is desirable, such a method of forming a silicon dioxide layer can include providing a semiconductor substrate having at least one silicon surface region having a curved surface, roughening the surface of the at least one silicon surface region to produce a layer of porous silicon, and thermally oxidizing the at least one roughened curved silicon surface region. Roughening the curved surface of the at least one silicon surface region can include forming pores having a diameter and a depth each being less than 20 nm.

Moreover, a method of producing an isolation collar of a storage trench capacitor forming part of a memory cell can include providing a semiconductor substrate having a trench with a curved inner surface of silicon, the trench can extend vertically with respect to the substrate surface. The cover layer having a material preventing roughening of an underlying material during roughening of the curved surface, and covering the surface regions which are not to be oxidized with a cover layer, roughening the surface of the curved silicon surface region so as to produce a layer of porous silicon and thermally oxidizing the roughened curved silicon surface region.

Silicon dioxide can be homogeneously grown on curved silicon surfaces, if the silicon surface is roughened before the thermal oxidation process. In particular, a roughening process producing pores having a structural size of less than 20 nm can produce achieved excellent results. The structural size can include both diameter and depth of the pores which both do not exceed 20 nm. Larger pores do not smooth the thickness variation of a thermal oxide formed in regions of curvedly shaped semiconductor product surfaces, whereas small pores having dimensions which are less than 20 nm can lead to improved thermal oxide layer thickness uniformity across regions having a curved shape.

On one side, as has been mentioned above, the growth rate depends on the crystal orientation of the underlying silicon layer. By roughening the silicon layer, on average, the crystal orientations are made isotropical and, as a consequence, a homogenous growth rate can be achieved.

Also or alternately, the stress inside the silicon and silicon dioxide layers depends on the curvature. When silicon dioxide is thermally grown, oxygen atoms from the surrounding atmosphere have to diffuse across the superficial silicon dioxide layer. The diffusion constant depends on the stress inside the silicon dioxide layer. By roughening the curved silicon surface, silicon atoms are removed and pores are created. These pores can reduce or make uniform the stress prevailing inside the silicon layer and, thus, can make uniform the silicon dioxide growth rate. As a consequence, silicon dioxide can thermally be grown with a homogenous growth rate even on curved surfaces.

The invention is applicable to surfaces of monocrystalline silicon and to surfaces of polycrystalline silicon as well.

According to the present invention, the size of the pores produced by the roughening step may not exceed 20 nm, for example, not exceed 10 nm. If the size of the pores is too large, the thermal oxide layer may become too unstable. On the other hand, if the size of the pores becomes too small, in particular, substantially lower than 1 nm, the effect of the present invention can be weak and the roughening may be insufficient. A porosity of 50%, even a pore size of 1 nm or smaller can provide satisfactory results.

According to the present invention, the creation of micropores having a defined size of less than 5 nm can be preferred, for example, since the dielectric constant of the grown silicon dioxide layer can be lowered. Moreover, if a microporous silicon surface region is produced, the effect of the crystal direction on the growth rate can become relatively negligible.

In particular, homogenity can be achieved if the partition walls between neighbouring pore structures can homogenously be oxidized. Since in the case of a microporous silicon surface region, the partition walls can have a thickness of 2 to 5 nm, this can be accomplished.

The roughening step can be accomplished by electrochemically or by electroless etching.

For example, generally known liquid mixtures can be used for electrochemically etching, such as a bath of a 6% aqueous solution of hydrofluoric acid, or a mixture of a 49% aqueous hydrofluoric acid and pure ethyl alcohol at a ratio of 0,75:0,25. In this case, an anodic etching process, as generally known in the art, can be performed.

Alternatively, the silicon surface, can be elctroless etched, for example, in a solution containing phosphoric acid, or a stain-etch solution, for example, having a composition of $H_2SO_4:HF:HNO_3=7:1:0.01$.

The use of an electroless etching process can be used since no electrical contact has to be made between the silicon surface region and a cathode placed in the etching solution. This can simplify the roughening step.

After the roughening step, a thermal oxidation step for thermally oxidizing the at least one roughened monocrystalline or polycrystalline silicon surface can be performed in accordance with commonly used methods. In particular, the substrate can be held at a temperature between 700° C. and 1200° C. in an oxidizing atmosphere, for example, pure oxygen or water. According to the present invention, the oxidation step can be performed so that the roughened portion can be oxidized, and the oxidized portion cab extend to a depth, which can be greater than the formerly roughened depth. As a consequence, sharp boundaries between silicon and silicon dioxide can be created. The oxidation time can depend on the size of the pores as well as on the thickness of the partition walls between neighbouring pores.

The method of the present invention can be applied for locally oxidizing a curved silicon surface according to the LOCOS process as mentioned above. In this case, the portions on which no silicon dioxide layer is to be formed can be covered by a masking material such as silicon nitride. The portions on which the silicon dioxide layer is to be formed can remain exposed to enable the reaction between the silicon and the oxygen in the oxidizing atmosphere. When covering the selected portions with a masking layer, special care can be taken to ensure that the masking material will not be affected by the etching solution for roughening the surface. In particular, if silicon nitride is used as the masking material, the etching solution should not contain phosphoric acid.

The method of forming a silicon dioxide layer can include forming a trench in the semiconductor substrate and forming the roughened surface in an upper portion of the trench. In particular, a trench having an upper portion and a lower portion may be formed and the lower portion may be completely filled with an electrode material before performing the step of roughening. Alternatively, after forming the roughened surface in the trench, the trench may be deepened to form a lower portion of the trench, the roughened surface being formed in the upper portion of the trench only.

By the present invention, curved silicon surfaces can be thermally oxidized so that a homogenous oxide thickness can be achieved. Accordingly, thermal oxidation and, in particular, the LOCOS process, can be applied for oxidizing curved surfaces, even if a homogenous layer thickness is necessary.

As a consequence of using the thermal oxidation process, the process can be cheaper and easier to perform. Moreover, since no deposition takes place the diameter of trenches to be provided with a $SiO_2$ liner, for example, will not substantially be reduced.

Moreover, if the silicon surface is made microporous in the roughening step, the growth rate of the silicon dioxide will not depend on the crystal orientation, and the resulting silicon dioxide layer can have a smaller dielectric constant than the conventional.

BRIEF DESCRIPTION OF THE FIGURES

In the following, the present invention will be explained in detail with reference to the accompanying drawings. Although the formation of the collar region of a DRAM cell is described, it is clearly to be understood that the invention can as well be used for thermally growing oxides which are used in any field of application, for example, including an isolator in wafer bonding or for forming contact holes.

FIGS. 1 to 5 illustrate the steps for forming a collar in a memory cell according to a first embodiment of the present invention;

FIG. 7 illustrates the layout of a memory cell array;

FIG. 12 illustrates the microscopic shape of a layer of roughened silicon.

DETAILED DESCRIPTION

Figure 1:
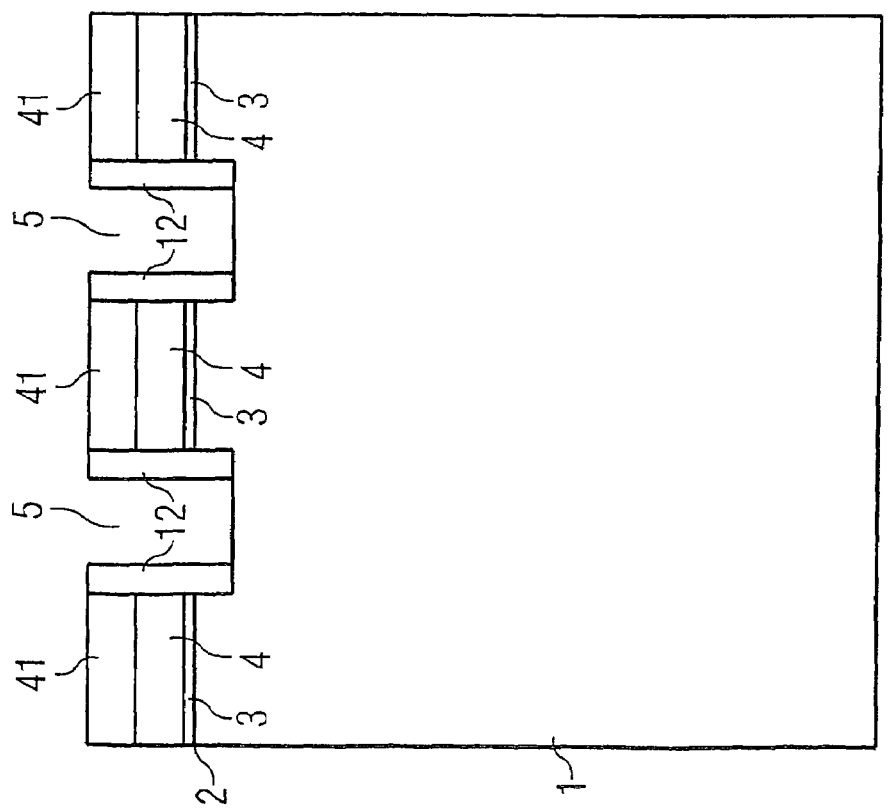

In FIG. 1, reference numeral 1 denotes a monocrystalline silicon substrate having a main surface 2. An $SiO_2$ layer 3 having a thickness of 5 nm and an $Si_3N_4$ 4 layer having a thickness of 200 nm can be coated onto the main surface 2. A boron silicate glass layer or a silicon oxide layer 41 having a thickness of 1000 nm can be applied as a hard mask material.

Using a photolithographically generated mask (not shown), the boron silicate glass mask layer or silicon oxide mask layer 41, the $Si_3N_4$ layer 4 and the $SiO_2$ layer 3 can be patterned by a plasma etching process using $CF_4/CH_3F$ to form a hard mask. After removal of the photolithographically generated mask trenches 5 having a depth of approximately 150 nm can be etched into the main surface 2 by a plasma etching process with HBr/NF$_3$ using the hard mask as an etching mask. The etching depth can be controlled by setting an appropriate etching time.

The trenches have, for example, a width of 100×250 nm and a distance of 100 nm from each other.

In a next step, a silicon nitride layer 12 having a thickness of 20 nm for protecting the buried strap portion can be deposited by a chemical vapour deposition process in the trenches. By anisotropically plasma etching using, for example, CHF$_3$, the bottom portion of the silicon nitride layer as well as the portion on top of the hard mask can be removed.

The trenches can be further etched by a plasma etching process with HBr/NF$_3$ using the hard mask as an etching mask so that an additional depth of 1 μm corresponding to the length of the isolation collar portion can be achieved.

Then, the process of the present invention for producing the isolation collar 9 can be performed. The isolation collar can provided for suppressing the parasitic transistor which could otherwise be formed in the upper trench region of a trench capacitor.

Accordingly, roughening the surface of the exposed silicon portion can be performed by etching in a stain etch, for example, of H$_2$SO$_4$:HF:HNO$_3$=7:1:0.01, for a time sufficient to generate micropores extending in a depth of approximately 20 nm in the surface area.

Figure 2:
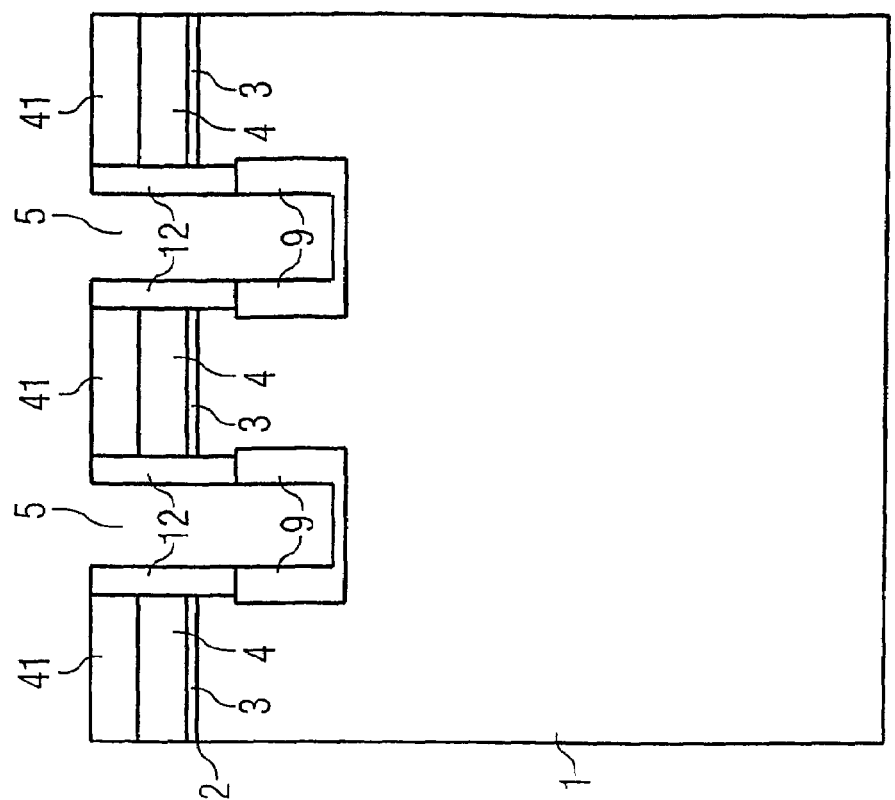

Thereafter, a thermal oxidation step can be performed. The wafer can be placed in an oxidation furnace at 1050° C. in an atmosphere of, for example, pure oxygen or water so as to form a silicon dioxide layer having a thickness of 25 nm. More specifically, the porous surface portion can be oxidized and, in addition, further 5 nm of the non-porous monocrystalline silicon material beneath the porous surface portion can be oxidized. The process parameters can be chosen in accordance with those usually employed. Since the upper part of the trench can be covered by the silicon nitride layer, the silicon oxide can be produced in the bottom part of the trench. (see FIG. 2)

According to the present invention, the trenches having an oval diameter can be covered by a uniform silicon dioxide layer having a homogenous thickness which is due to the roughening.

Thereafter, the SiO$_2$ layer on the bottom portion of the trenches can be removed by anisotropically etching using C$_4$F$_8$ as an etching gas. Optionally, a silicon nitride liner can be deposited for protecting the collar region during the following processes.

Figure 3:
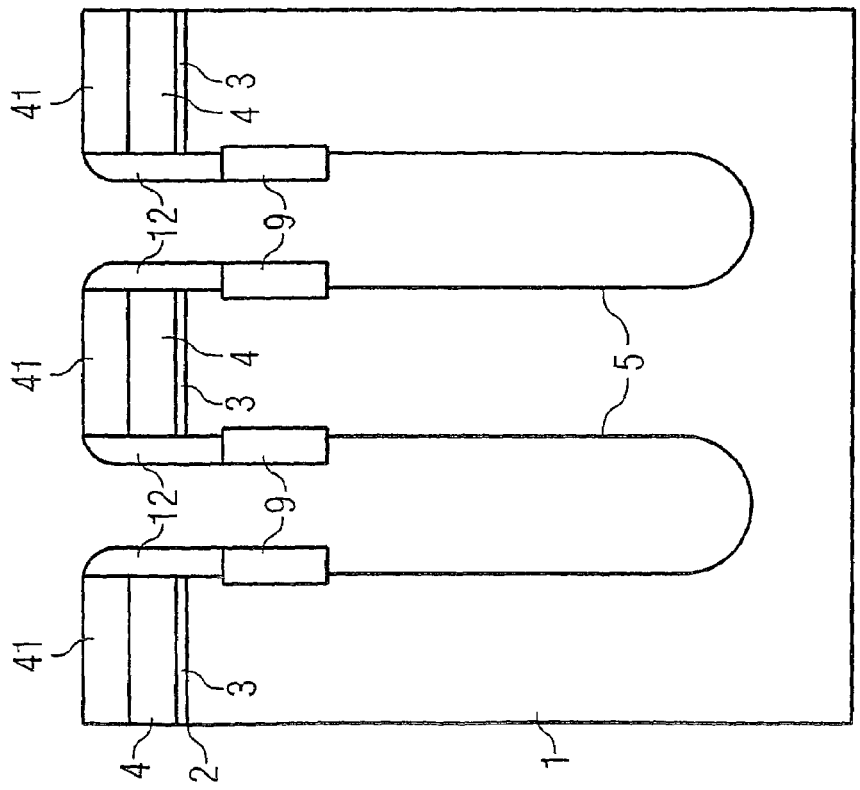

Then, the trenches can be further etched by plasma etching process with HBr/NF$_3$ using the hard mask as an etching mask until the final depth of 5 μm can be achieved. (see FIG. 3)

Thereafter, the commonly used process for forming a DRAM cell can be performed.

Figure 4:
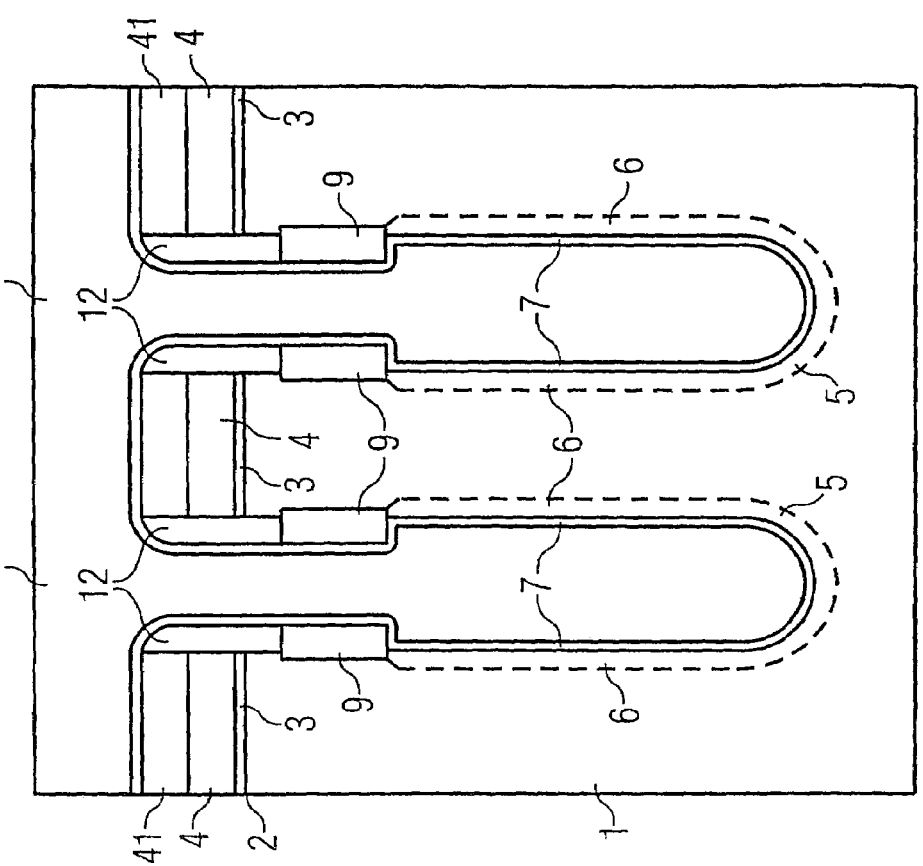

To this end, first, the bottom electrode 6, the capacitor dielectric 7 and the top electrode 8 of the storage capacitor can be formed. The bottom electrode 6 can, for example, be implemented as a highly doped region or as a metallic electrode as is generally known in the art. As the capacitor dielectric 7, a layer having a thickness of approximately 5 nm including SiO$_2$ and Si$_3$N$_4$ as well as optionally silicon oxynitride can be used. However, other known materials, such as Al$_2$O$_3$, TiO$_2$ or Ta$_2$O$_5$ or a mixture of these, can be used. The upper electrode 8 can, for example, be formed by depositing a polysilicon layer 10 which is doped in situ having a thickness 200 nm. (see FIG. 4)

Thereafter, the top electrode can be patterned in a suitable manner and it can be connected with the source/drain portions of an access transistor.

For example, this can be accomplished by etching the polysilicon trench fill 10 up to approximately 200 nm beneath the main surface 2. Then, the dielectric layer 7 can be removed from the surface of the silicon nitride layer 12 protecting the trench wall, for example, by deglassing step, which can be performed by shortly dipping the substrate into a hydrofluoric acid thus removing silicon oxynitride. Then, the silicon nitride layer 12 can be removed, for example, by etching in hot phosphoric acid. As a consequence, the upper portion of the trench wall can be exposed for forming a buried strap. (see FIG. 5)

After a sacrifical oxidation for forming a scattering oxide (not shown), an implantation step can be performed so as to create a n$^+$-doped region 14 in the side wall of each trench 5 in the main surface 2 portion.

Figure 6:
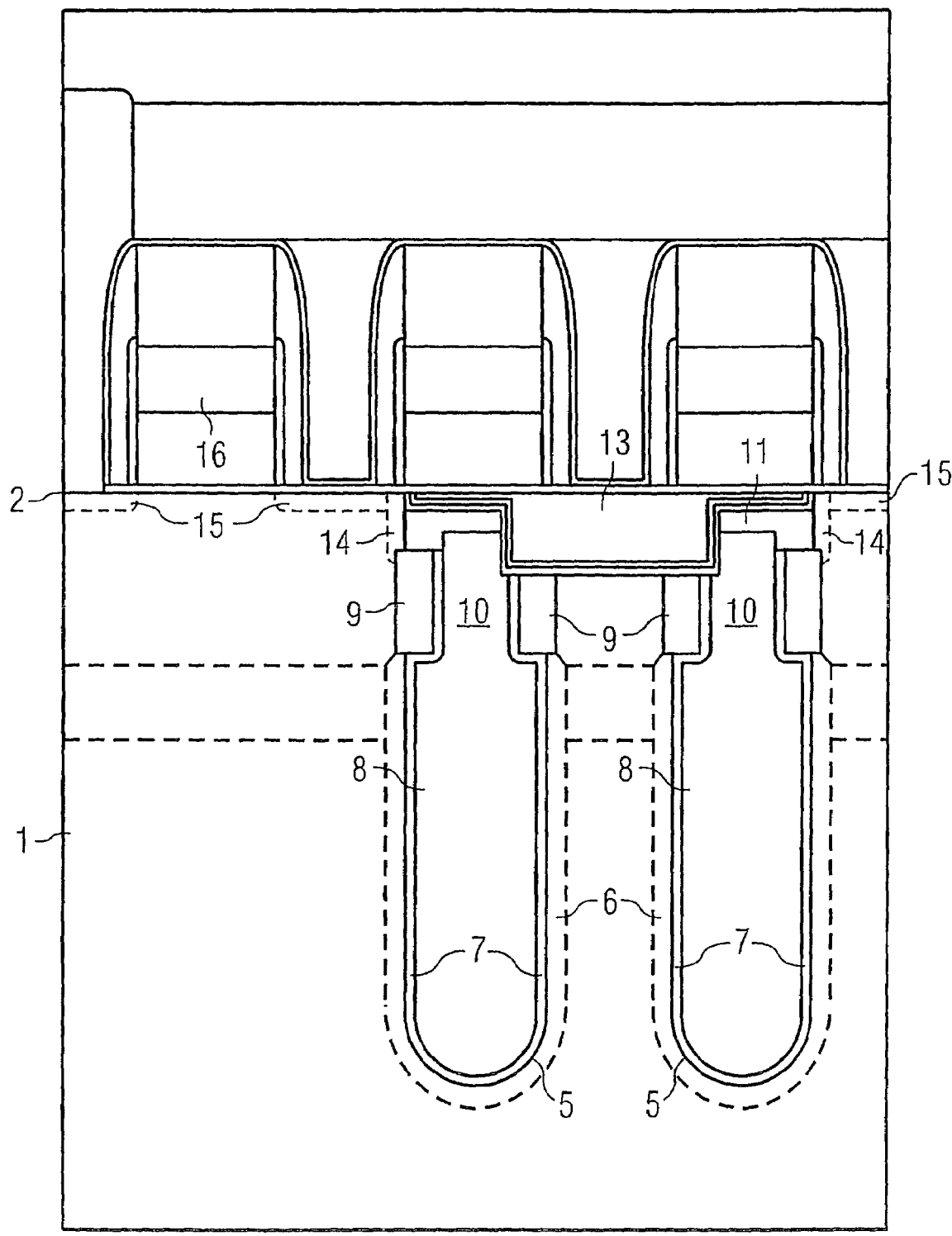
FIG. 6 schematically illustrates a cross sectional view of the completed memory cell according to the first and a second embodiment of the present invention.

As is shown in FIG. 6, the space above the poly silicon fill 10 in each of the trenches 5 can be filled by depositing in situ doped polysilicon and etching back the polysilicon with SF$_6$ to form a polysilicon fill 11. The polysilicon fill 11 can act as a buried strap connecting the top capacitor electrode 8 and the n$^+$-doped region 14.

In a following step, isolation portions 13 for providing shallow trench isolation surrounding and defining the active areas can be formed. To this end, a mask, which can define the active areas, can be formed. By non-selectively plasma etching of silicon, silicon dioxide and polysilicon using CHF$_3$/N$_2$/NF$_3$ with an etching time, which can be adjusted to etch 200 nm polysilicon, by removing the photoresist mask used therefor with O$_2$/N$_2$, by wet chemical etching of 3 nm dielectric layer, by oxidation and depositing a Si$_3$N$_4$ layer having a thickness of 5 nm and by depositing a SiO$_2$ layer having a thickness of 250 nm by a TEOS process and subsequent chemical mechanical polishing, the isolation portions 8 are finished. The Si$_3$N$_4$ layer 4 can be removed by etching in hot phosphoric acid and the SiO$_2$ layer 3 can be removed by etching in diluted hydrofluoric acid.

Next, by performing a sacrificial oxidation, a scattering oxide can be formed. Photolithographically generated masks and implantations can be used for forming n-doped wells, p-doped wells and for performing implantations for setting the threshold voltages in the peripheral portion and the access transistors of the cell array. Moreover, an implantation with high energetic ions can be performed for doping the substrate portion which is remote from the main surface 2. Thereafter, a n$^+$-doped region will be formed by a buried-well implant for connecting neighbouring bottom electrodes 6 with each other.

In the following, the transistor can be completed by defining the gate oxide as well as the gate electrode 16, corresponding wirings and the source and drain electrode 15, respectively, using commonly used process steps.

Thereafter, the memory cell array can be finished by forming further metalization layers as is generally known in the art.

FIG. 7 shows the layout of an exemplary memory cell array implementing a 8-F$^2$-cell architecture including a storage trench capacitor and a planar transistor for each of the memory cells. For each of the memory cells an area of 8F$^2$ is needed, wherein F denotes the smallest structural length, which can be produced in the technology employed. The bit lines BL can be implemented as stripes and can extend parallel to each other, wherein the width as well as the distance between each of the bitlines amount to F, respectively. The word lines WL each having a width as well as a distance to each other of F, respectively, can be arranged perpendicularly to the bitlines BL.

The active areas A of each of the memory cells can be arranged beneath the bit lines BL, and two wordlines WL can cross each other above each of the active areas A. The active areas A can be arranged at staggered positions to each other beneath neighbouring bit lines BL. The trenches 5 having an oval diameter can be disposed beneath the word lines WL. A gate electrode 16 of the corresponding transistor is disposed at the crossing points between one of the bit lines BL and one of the wordlines WL within the active areas A.

The active areas A can extend between two trenches 5. Each of the active areas A can include two transistors, which can be connected with the corresponding bitline BL via a common bitline contact BLK. In dependence from the actuated wordline WL, the corresponding storage capacitor, which can be disposed in one of the two trenches 5, can be read out.

Monocrystalline silicon surfaces as well as with polycrystalline silicon surfaces can also be used.

Figure 8:
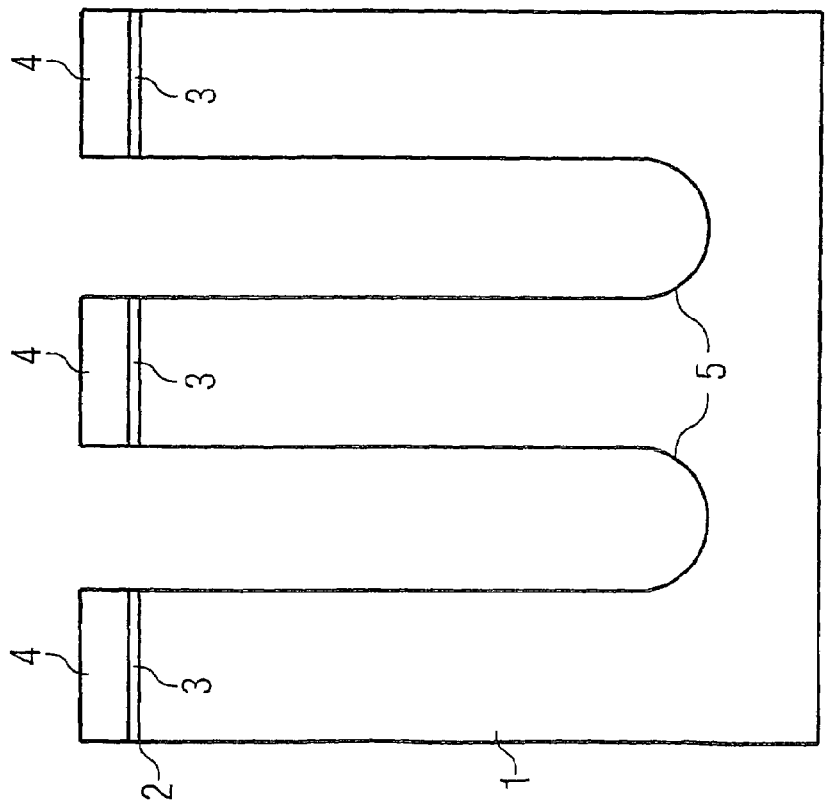

According to a second embodiment of the present invention, as is shown in FIG. 8, the deep trenches 5 can be etched before performing the process of the present invention. A monocrystalline silicon substrate having a main surface 2 can be coated with an $SiO_2$ layer 3 having a thickness of 5 mn and an $Si_3N_4$ 4 layer having a thickness of 200 nm. A boron silicate glass layer (not shown) having a thickness of 1000 nm can be applied as a hard mask material.

Using a photolithographically generated mask (not shown), the boron silicate glass layer, the $Si_3N_4$ layer 4 and the $SiO_2$ layer 3 can be patterned by a plasma etching process using $CF_4/CH_3F$ so as to form a hard mask. After removal of the photolithographically generated mask, the trenches 5 can be etched into the main surface 2 by a further plasma etching process with $HBr/NF_3$ using the hard mask as an etching mask.

The trenches 5, for example, can have a depth of 5 µm, a width of 100×250 nm and a distance from each other of 100 nm. (see FIG. 8)

Then, the bottom electrode 6, the capacitor dielectric 7 and the top electrode 8 of the storage capacitor can be formed. The bottom electrode 6 can, for example, be implemented as a highly doped region or as a metallic electrode as is generally known in the art. In dependence from the specific implementation of the bottom electrode 6, it can be necessary to provide a silicon nitride layer for protecting the collar portion of the trench. In particular, in case the bottom electrode 6 is implemented as a highly doped region, which can be generated by diffusion doping using a gaseous source such as $AsH_3$, for example, it will be necessary to provide a silicon nitride layer as is generally known in the art in the upper trench portion in order to prevent the collar region from being doped.

Figure 9:
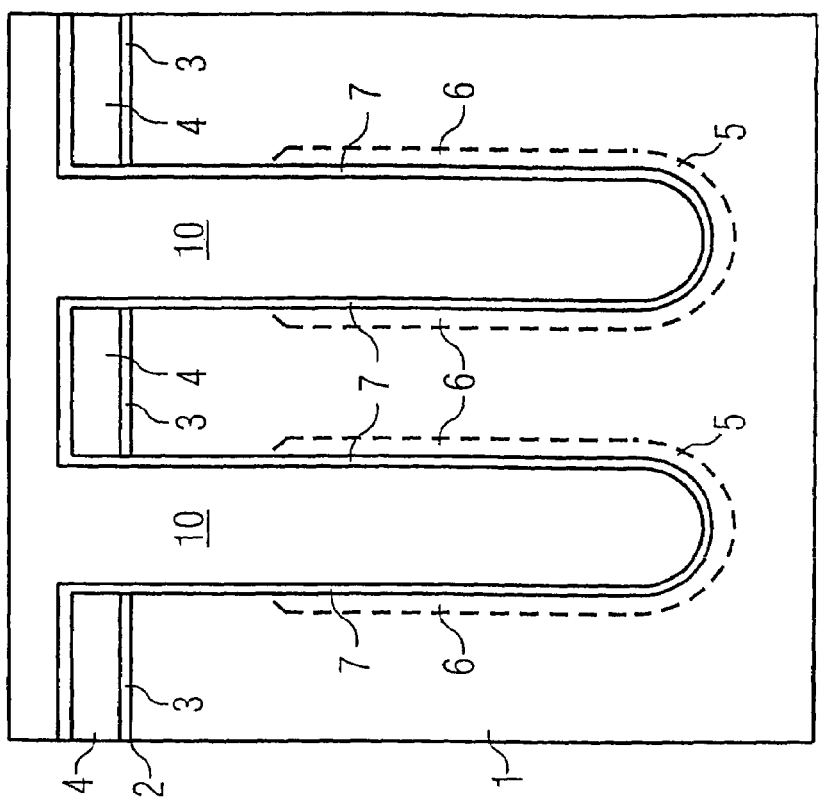
FIGS. 8 to 11 illustrate the steps for forming a collar in a memory cell according to the second embodiment of the present invention.

As the capacitor dielectric 7, a layer having a thickness of approximately 5 nm including $SiO_2$ and $Si_3N_4$ as well as optionally silicon oxynitride can be used. However, other known materials such as $Al_2O_3$, $TiO_2$ or $Ta_2O_5$ or a mixture of these can be used. The upper electrode 8 can, for example, be formed by depositing a polysilicon layer 10, which can be doped in situ having a thickness 200 nm (see FIG. 9).

The upper electrode material 10 can be recessed for preparing the buried strap contact. To this end, approximately 150 nm of the polysilicon layer can be etched with $SF_6$.

Then, the dielectric layer 7 can be removed from the surface of the upper trench wall, for example, by a deglassing step, which can be performed by shortly dipping the substrate into a hydrofluoric acid thus removing silicon oxynitride.

Thereafter, a silicon nitride layer 12 having a thickness of 20 nm for protecting the surface strap portion can be deposited by a chemical vapor deposition process in the trenches. By anisotropically plasma etching using $CHF_3$, the bottom portion of the silicon nitride layer as well as the silicon nitride layer on top of the boron silicate glass layer can be removed.

Then, the upper capacitor electrode material 15 can be further recessed by 1 µm so as to define the collar region. To this end, again, an isotropic plasma etching step with $SF_6$ can be performed.

Figure 10:
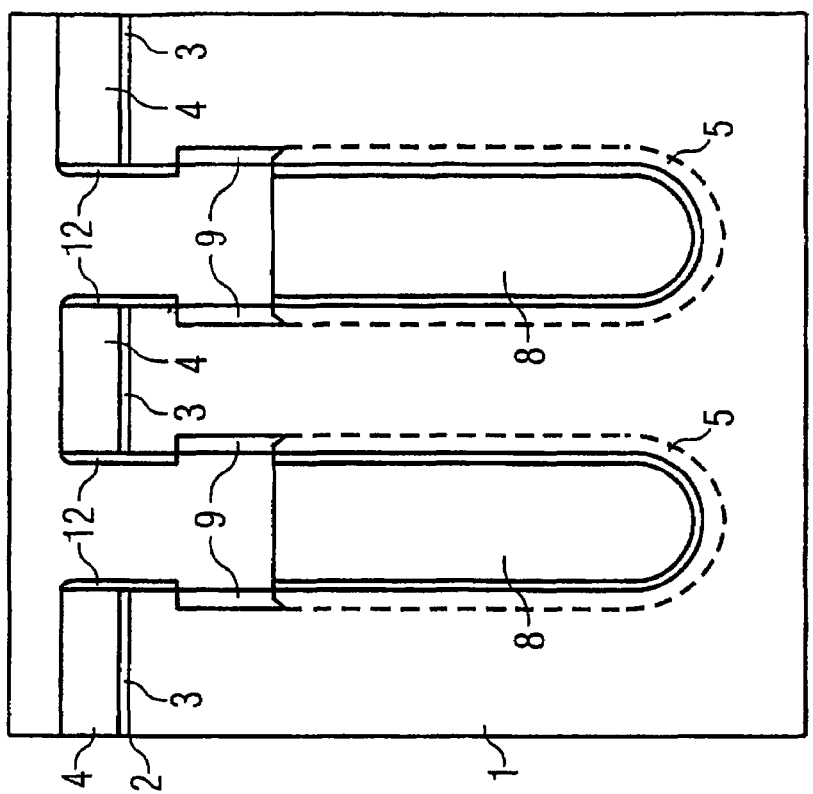

Again, the dielectric layer 7 can be removed from the surface of the exposed trench wall, for example, by a deglassing step, which can be performed by shortly dipping the substrate into a hydrofluoric acid thus removing silicon oxynitride (see FIG. 10).

Then, the process of the present invention for producing the isolation collar 9 can be performed. The isolation collar can be provided for suppressing the parasitic transistor which otherwise would be formed in the upper trench region of a trench capacitor.

Accordingly, roughening the surface of the exposed silicon portion can be performed by etching in a stain etch, for example, of $H_2SO_4$:HF:$HNO_3$=7:1:0.01, for a time sufficient so as to generate micropores extending in a depth of approximately 20 nm in the surface area.

Thereafter, a thermal oxidation step can be performed. To this end, the wafer can be placed in an oxidation furnace at 1050° C. in an atmosphere of for example pure oxygen or water to form a silicon dioxide layer having a thickness of 25 nm. More specifically, the porous surface portion can be oxidized and, in addition, further 5 nm of the non-porous monocrystalline silicon material beneath the porous surface portion can be oxidized. The process parameters are chosen in accordance with those usually employed. Since the upper part of the trench has been covered by a silicon nitride layer, the oxide layer can be generated in the lower portion of the trench.

According to the present invention, the trenches having an oval diameter can be covered by a uniform silicon dioxide layer having a homogenous thickness which is due to the roughening.

Figure 11:
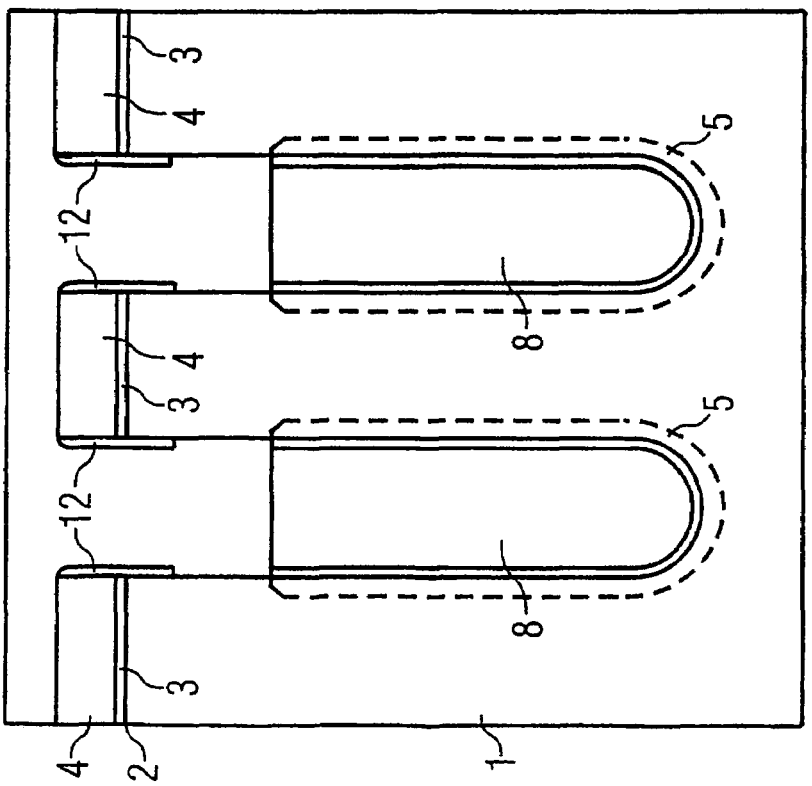

Thereafter, the $SiO_2$ layer on the bottom portion of the trenches can be removed by anisotropically etching using $C_4F_8$ as an etching gas. Optionally, a silicon nitride liner can be deposited for protecting the collar region during the following process steps (see FIG. 11).

Thereafter, the commonly used process for forming a DRAM cell can be continued by connecting the upper capacitor electrode with the source/drain portions of an access transistor.

Accordingly, first, the trench portion can be filled with polysilicon can be which is in situ doped. Then, the polysilicon trench fill is etched up to approximately 200 nm beneath the main surface 2. Thereafter, the trench walls are exposed for forming a buried strap. Accordingly, the protecting layers covering the trench wall can be removed. In particular, the silicon nitride layer 12 can be removed, for example, by etching in hot phosphoric acid.

After a sacrificial oxidation for forming a scattering oxide (not shown), an implantation step can be performed so as to create a $n^+$-doped region 14 in the side wall of each trench 5 in the main surface 2 portion.

As is shown in FIG. 6, the space above the poly silicon fill in each of the trenches 5 can be filled by depositing in situ doped polysilicon and etching back the polysilicon with $SF_6$ so as to form a polysilicon fill 11. The polysilicon fill 11 can act as a buried strap connecting the top capacitor electrode 8 and the $n^+$-doped region 14.

In a following step, isolation portions 13 for providing shallow trench isolation surrounding and defining the active areas can be formed. To this end, a mask, which can define the active areas, can be formed. By non-selectively plasma etching of silicon, silicon dioxide and polysilicon using $CHF_3/N_2/NF_3$ with an etching time, which can be adjusted to etch 200 nm polysilicon, by removing the photoresist mask used therefor with $O_2/N_2$, by wet chemical etching of 3 nm dielectric layer, by oxidation and depositing a $Si_3N_4$ layer having a thickness of 5 nm, and by depositing a $SiO_2$ layer having a thickness of 250 nm by a TEOS process and subsequent chemical mechanical polishing the isolation portions 13 are finished. The $Si_3N_4$ layer 4 can be removed by etching in hot phosphoric acid and the $SiO_2$ layer 3 can be removed by etching in diluted hydrofluoric acid.

Next, by performing a sacrifical oxidation, a scattering oxide can be formed. Photolithographically generated masks and implantations can be used for forming n-doped wells, p-doped wells and, for performing implantations for setting the threshold voltages in the peripheral portion and the access transistors of the cell array. Moreover, an implantation with high energetic ions can be performed for doping the substrate portion which, can be remote from the main surface 2. Thereafter, a $n^+$-doped region can be formed by a buried-well implant for connecting neighbouring bottom electrodes 6 with each other.

In the following, the transistor can be completed by defining the gate oxide as well as the gate electrode 16, corresponding wirings and the source and drain electrode 15, respectively, using commonly used process steps.

Thereafter, the memory cell array can be will be finished in a commonly used manner by forming further metalization layers.

FIG. 12 illustrates the microscopic shape of a roughened silicon surface having a curved macroscopic surface. On a substrate 1 having a main surface 2 a topography 31 can be formed. The surface of the substrate 2 including the topography 31 can be covered with a silicon layer, which can be roughened to form pores. According to the invention, pores can be formed, which can have structural size dimensions of less than 20 nm. Thus, according to FIG. 12, pores 34, 35, 36 can have a depth d of less than 20 nm and can have a width w of less than 20 nm.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

We claim:

1. A method of forming a silicon dioxide layer, comprising:
    providing a semiconductor substrate, the semiconductor substrate including at least one silicon surface region with a curved surface;
    roughening the surface of the at least one silicon surface region to produce a layer of porous silicon, wherein roughening the surface of the at least one silicon surface region includes forming pores, the pores each having a width of less than 20 nm and a pore depth of less than 20 nm;
    thermally oxidizing the at least one roughened curved silicon surface region; and
    oxidizing the at least one silicon surface region to produce an oxidized portion within the semiconductor substrate which ends at a depth, the depth being greater than the pore depth of the pores;
    wherein the surface regions which are not to be oxidized are covered with a masking layer before roughening the surface of the at least one silicon surface region.

2. The method of claim 1, wherein roughening the surface of the at least one silicon surface region includes producing pores, the pores each having a size of less than 10 nm.

3. The method of claim 2, wherein roughening the surface of the at least one silicon surface region includes producing pores, the pores each having a size of less than 5 nm.

4. The method of claim 1, wherein roughening the surface of the at least one silicon surface region includes etching the surface region.

5. The method of claim 4, wherein etching the surface region includes etching in a solution containing phosphoric acid.

6. The method of claim 4, wherein etching the surface region includes etching in a solution including $H_2SO_4$, HF and $HNO_3$.

7. The method of claim 6, wherein etching the surface region includes etching in a solution having a composition of $H_2SO_4$:HF:$HNO_3$=7:1:0.01.

8. The method of claim 4, wherein roughening the surface of the at least one silicon surface region includes electrochemically etching the surface region.

9. The method of claim 8, wherein roughening the surface of the at least one silicon surface region includes etching the surface region with a mixture of hydrofluoric acid and ethyl alcohol.

10. The method of claim 9, wherein roughening the surface of the at least one silicon surface region includes etching the surface region with a mixture of 49% aqueous hydrofluoric acid and pure ethyl alcohol at a ratio of 0.75:0.25.

11. The method of claim 8, wherein roughening the surface of the at least one silicon surface region includes etching the surface region with a 6% aqueous solution of hydrofluoric acid.

12. The method of claim 1, wherein the masking layer includes silicon nitride.

13. The method of claim 1, wherein thermally oxidizing the at least one roughened silicon surface forms a silicon dioxide layer having a thickness larger than the pore depth of the pores.

14. The method of claim 1, wherein the silicon surface region includes monocrystalline silicon.

15. A method of producing a storage trench capacitor for a memory cell including an isolation collar, comprising:
    providing a semiconductor substrate, the semiconductor substrate including a main surface;
    providing a trench in the semiconductor substrate, the trench extending from the main surface into the semiconductor substrate, the trench including an upper and a lower portion, the trench including a curved inner surface of silicon;
    masking the silicon surface region of the upper portion of the trench which is not to be oxidized with a masking layer;

exposing the silicon surface region of the lower portion of the trench on which a silicon dioxide layer is to be formed;

roughening the exposed silicon surface region in the lower portion of the trench to produce a layer of porous silicon, the masking layer having a material which prevents roughening of an underlying material during roughening of the exposed silicon surface region;

thermally oxidizing the roughened silicon surface region;

extending the trench into the semiconductor substrate to form a bottom portion of the trench beneath the lower portion of the trench;

forming a first electrode of the capacitor in the semiconductor substrate adjacent to the bottom portion of the trench;

forming a dielectric layer of the capacitor in the bottom portion of the trench; and forming a second electrode of the capacitor in the bottom portion of the trench.

16. The method of claim 15, wherein the masking layer includes silicon nitride.

17. The method of claim 15, wherein roughening the exposed silicon surface region includes etching the exposed silicon surface region.

18. The method of claim 15, wherein roughening the exposed silicon surface region includes producing pores in the exposed silicon surface region, the pores having a diameter of less than 20 nm.

19. The method of claim 15, wherein thermally oxidizing the roughened silicon surface region forms a silicon dioxide layer having a thickness larger than the depth of the pores.

20. A method of producing a storage trench capacitor for a memory cell including an isolation collar, comprising:

providing a semiconductor substrate, the semiconductor substrate including a main surface;

providing a trench in the semiconductor substrate, the trench extending from the main surface, the trench including an upper portion, a lower portion, and a bottom portion, the upper portion being disposed above the lower portion which is disposed above the bottom portion, and wherein the trench includes a curved inner surface of silicon;

forming a first electrode of the capacitor in the semiconductor substrate adjacent to the bottom portion of the trench, forming a dielectric layer in the bottom portion of the trench and forming a second electrode of the capacitor in the bottom portion of the trench;

masking the silicon surface region of the upper portion of the trench which is not to be oxidized with a masking layer;

exposing the silicon surface portion in the lower portion of the trench on which a silicon dioxide layer is to be formed;

roughening the exposed silicon surface region in the lower portion of the trench to produce a layer of porous silicon, the masking layer including a material which prevents roughening of an underlying material during roughening of the exposed silicon surface region; and thermally oxidizing the roughened silicon surface region.

21. The method of claim 20, wherein the masking layer includes silicon nitride.

22. The method of claim 20, wherein roughening the surface of the exposed silicon surface region includes etching the exposed silicon surface region.

23. The method of claim 20, wherein roughening the surface of the exposed silicon surface region includes producing pores in the exposed silicon surface region, the pores having a diameter of less than 20 nm.

24. The method of claim 20, wherein thermally oxidizing the roughened silicon surface region forms a silicon dioxide layer having a thickness larger than the depth of the pores.

25. The method of claim 1, wherein the silicon surface region includes polycrystalline silicon.

26. A method of forming a silicon dioxide layer, comprising:

providing a semiconductor substrate, the semiconductor substrate including at least one silicon surface region with a curved surface;

roughening the surface of the at least one silicon surface region to produce a layer of porous silicon, wherein roughening the surface of the at least one silicon surface region includes etching the surface region in a solution including $H_2SO_4$, HF and $HNO_3$ to form pores, the pores each having a width of less than 20 nm and a pore depth of less than 20 nm;

thermally oxidizing the at least one roughened curved silicon surface region; and oxidizing the at least one silicon surface region to produce an oxidized portion within the semiconductor substrate which ends at a depth, the depth being greater than the pore depth of the pores.

27. A method of forming a silicon dioxide layer, comprising:

providing a semiconductor substrate, the semiconductor substrate including at least one silicon surface region with a curved surface;

roughening the surface of the at least one silicon surface region to produce a layer of porous silicon, wherein roughening the surface of the at least one silicon surface region includes etching the surface region with a mixture of 49% aqueous hydrofluoric acid and pure ethyl alcohol at a ratio of 0.75:0.25 to form pores, the pores each having a width of less than 20 nm and a pore depth of less than 20 nm;

thermally oxidizing the at least one roughened curved silicon surface region; and oxidizing the at least one silicon surface region to produce an oxidized portion within the semiconductor substrate which ends at a depth, the depth being greater than the pore depth of the pores.

28. A method of forming a silicon dioxide layer, comprising:

providing a semiconductor substrate, the semiconductor substrate including at least one silicon surface region with a curved surface, wherein the at least one silicon surface region includes monocrystalline silicon;

roughening the surface of the at least one silicon surface region to produce a layer of porous silicon, wherein roughening the surface of the at least one silicon surface region includes forming pores, the pores each having a width of less than 20 nm and a pore depth of less than 20 nm;

thermally oxidizing the at least one roughened curved silicon surface region; and oxidizing the at least one silicon surface region to produce an oxidized portion within the semiconductor substrate which ends at a depth, the depth being greater than the pore depth of the pores.

* * * * *